US006770918B2

(12) United States Patent
Russ et al.

(10) Patent No.: US 6,770,918 B2
(45) Date of Patent: Aug. 3, 2004

(54) ELECTROSTATIC DISCHARGE PROTECTION SILICON CONTROLLED RECTIFIER (ESD-SCR) FOR SILICON GERMANIUM TECHNOLOGIES

(75) Inventors: Cornelius Christian Russ, Princeton, NJ (US); John Armer, Middlesex, NJ (US); Markus Paul Josef Mergens, Plainsboro, NJ (US); Phillip Czeslaw Jozwiak, Plainsboro, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/238,699

(22) Filed: Sep. 10, 2002

(65) Prior Publication Data

US 2003/0047750 A1 Mar. 13, 2003

Related U.S. Application Data

(60) Provisional application No. 60/318,550, filed on Sep. 11, 2001.

(51) Int. Cl.[7] .......................... H01L 29/72; H01L 23/62
(52) U.S. Cl. ...................... 257/173; 257/358; 257/361; 257/362; 257/363
(58) Field of Search ................................ 257/173, 174, 257/358, 361, 362, 363

(56) References Cited

U.S. PATENT DOCUMENTS

| 3,827,073 A | * | 7/1974 | Mize ........................... 257/126 |
| 5,268,588 A | | 12/1993 | Marum ........................ 257/362 |
| 5,591,661 A | | 1/1997 | Shiota ........................... 437/56 |
| 5,708,288 A | | 1/1998 | Quigley et al. ............. 257/355 |
| 5,747,834 A | | 5/1998 | Chen et al. .................. 257/111 |
| 5,808,342 A | | 9/1998 | Chen et al. .................. 257/357 |
| 5,821,572 A | | 10/1998 | Walker et al. .............. 257/107 |
| 6,169,309 B1 | | 1/2001 | Teggatz et al. ............. 257/328 |
| 6,396,107 B1 | | 5/2002 | Brennan et al. ............. 257/362 |
| 6,576,959 B2 | * | 6/2003 | Kunz et al. .................. 257/355 |

OTHER PUBLICATIONS

"Electrostatic Discharge Characterization of Epitaxial–Base Silicon–Germanium Heterojunction Bipolar Transistors", by S. Voldman, et al, pp. 239 through 250; from Electrical Overstress/Electrostatic Discharge Symposium Proceedings, Anaheim, CA, Sep. 26–28, 2000.
"Modern Semiconductor Devices Physics," ©1998 by John Wiley & Sons, Inc., p. 51.
"Semiconductor Devices, Physic & Technology," ©1985 by Bell Telephone Laboratories, Inc., p. 154.

* cited by examiner

Primary Examiner—Ngân V. Ngô
(74) Attorney, Agent, or Firm—William J. Burke

(57) ABSTRACT

An electrostatic discharge (ESD) protection device having a silicon controlled rectifier (SCR) for protecting circuitry of an integrated circuit (IC). The SCR includes a N-doped layer disposed over a substrate and a first P doped region disposed over the N-doped layer. At least one first N+ doped region forming a cathode is disposed over the P-doped region and coupled to ground. The at least one first N+ doped region, first P-doped region, and N-doped layer form a vertical NPN transistor of the SCR. A second P doped region forming an anode is coupled to a protected pad. The second P doped region is disposed over the N-doped layer, and is laterally positioned and electrically isolated with respect to the first P doped region. The second P doped region, N-doped layer, and first P doped region form a lateral PNP transistor of the SCR.

36 Claims, 9 Drawing Sheets

ELECTROSTATIC DISCHARGE PROTECTION SILICON CONTROLLED RECTIFIER (ESD-SCR) FOR SILICON GERMANIUM TECHNOLOGIES

CROSS REFERENCE TO RELATED APPLICATION

This patent application claims the benefit of U.S. Provisional Application, Ser. No. 60/318,550, filed Sep. 11, 2001, the contents of which are incorporated by reference herein.

FIELD OF THE INVENTION

This invention generally relates to the field of electrostatic discharge (ESD) protection circuitry, and more specifically, silicon controlled rectifier (SCR) structures useful in ESD protection circuitry.

BACKGROUND OF THE INVENTION

Technologies utilizing high frequency signals, such as the mobile telephone and other wireless devices, are currently incorporating silicon germanium (SiGe) into the integrated circuits (ICs). The silicon germanium technology gives the chip manufacturers the ability to satisfy the analog/RF design requirements, such as transistor speed, while maintaining a high transistor current gain. The introduction of a SiGe layer over a silicon layer (e.g., N-epitaxial layer) forms a heterojunction therebetween. Accordingly, a heterojunction bipolar transistor (HBT) may be formed and integrated with functional circuitry, e.g., complimentary metal oxide semiconductor (CMOS) circuitry, on a chip. That is, the HBTs are used as functional RF circuitry, where the SiGe layer allows for producing high-speed transistors, which may be used for RF applications.

Semiconductor devices, such as IC's having the SiGe HBT transistors are sensitive to the high voltages that may be generated by contact with an ESD event. As such, electrostatic discharge (ESD) protection circuitry is essential for integrated circuits. An ESD event commonly results from the discharge of a high voltage potential (typically, several kilovolts) and leads to pulses of high current (several amperes) of a short duration (typically, 100 nanoseconds).

Recent studies have shown that functional heterojunction bipolar transistors also have some intrinsic ESD protection capabilities. For example, in one publication, it was shown that a functional HBT, without any additional ESD protection circuitry, was found to have measurable intrinsic ESD protection characteristics, as between two transistor terminals (e.g., base-collector, base-emitter, and the like). For a detailed understanding of one such study, the reader is directed to the publication entitled "Electrostatic Discharge Characterization of Epitaxial-Base Silicon-Germanium Heterojunction Bipolar Transistors" by S. Voldman et al., Electrical Overstress/Electrostatic Discharge Symposium Proceedings 2000, EOS-22, pp.239–250, IEEE Catalog No. 00TH8476, ISBN-1-58537-018-5.

However, the intrinsic ESD protection capabilities of a functional heterojunction bipolar transistor are limited, such that ESD protection (voltage clamping and current capability) for the functional circuitry may not be adequately provided. For example, an emitter-base junction can handle only very limited ESD current until a destructive failure occurs. One reason is that the ESD stress current has to flow from the base contact to the active base-emitter junction. Therefore, the current will flow in the extremely thin (e.g., 50 nanometers) layer of the SiGe that is connecting the base contact to the active transistor region. This leads to an early failure, as well as a significant voltage build-up at the device terminals, which makes the device unpractical for any ESD application, for example, of protecting RF receiver inputs where the base of the HBT is connected to the input terminal while the emitter is grounded.

An additional reason for such low current ESD failures may also be attributed to the long and narrow base polycrystalline silicon connections that become necessary in practical RE transistor layout. Along these base polycrystalline silicon connections, resistance increases, while the voltage drops during ESD, which is not permissible. Therefore, there is a need in the art for improved ESD protection devices in semiconductor technologies utilizing silicon-germanium technologies.

SUMMARY OF INVENTION

The disadvantages heretofore associated with the prior art are overcome by the present invention of an electrostatic discharge (ESD) protection device having a silicon controlled rectifier (SCR) for protecting circuitry of an integrated circuit (IC). The SCR comprises a vertical NPN transistor and a lateral PNP transistor.

In one embodiment, an N-doped (e.g., lightly doped or N-epitaxial) layer is disposed over a substrate and a first P doped region disposed over the N-epitaxial layer. A first N+ doped region is disposed over the P-doped region and coupled to ground. The first N+ doped region, first P-doped region, and N-epitaxial layer form the vertical NPN transistor of the SCR, where the first N+ doped region forms the cathode of the SCR.

A second P doped region is coupled to a protected pad. The second P doped region forms an anode of the SCR, and is disposed over the N-epitaxial layer and laterally positioned with respect to the first P doped region and electrically isolated from the first P doped region. The second P doped region, N-epitaxial layer, and first P doped region form the lateral PNP transistor of the SCR. A triggering device may be coupled to a gate of the SCR. For example, an external on-chip triggering device may be coupled to the gate of the SCR, where the triggering device resides on the same IC, but the triggering device does not share any components with the SCR. Alternatively, an integrated triggering device may be coupled to the gate of the SCR, where the triggering device resides on the same IC, as well as shares at least one component with the SCR.

In one embodiment, the first P-doped region is fabricated from a silicon-germanium (SiGe) lattice. As such, the vertical NPN transistor is a heterojunction bipolar transistor (HBT), which has low junction capacitance between the base (SiGe layer) and the collector (N-epi Si). An SCR incorporating a vertical HBT of the present invention is suitable for protecting circuitry operating under high frequency applications, such as circuitry in wireless devices.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

The process steps and structures described below do not form a complete process flow for manufacturing integrated circuits (ICs). Rather, since the present invention can be practiced in conjunction with integrated circuit fabrication techniques currently used in the art, a portion of the commonly practiced process steps is included as necessary to assist in understanding of the present invention. The figures representing cross-sections and layouts of portions of an IC during fabrication are not drawn to scale, but instead are drawn to illustrate the various features of the invention. Furthermore, where possible, the figures illustratively include a schematic diagram of the circuitry (e.g., an SCR circuit) as related to the P and N-type doped regions of the integrated circuit.

Figure 1A:
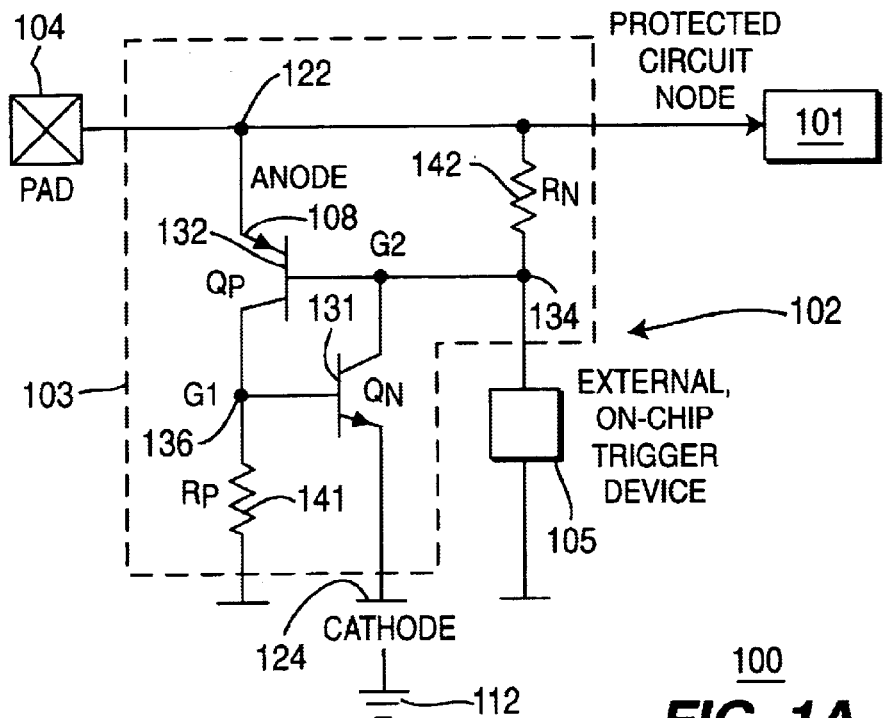
FIGS. 1A and 1B depict schematic diagram embodiments of an SCR ESD protection device of the present invention.
Figure 1B:
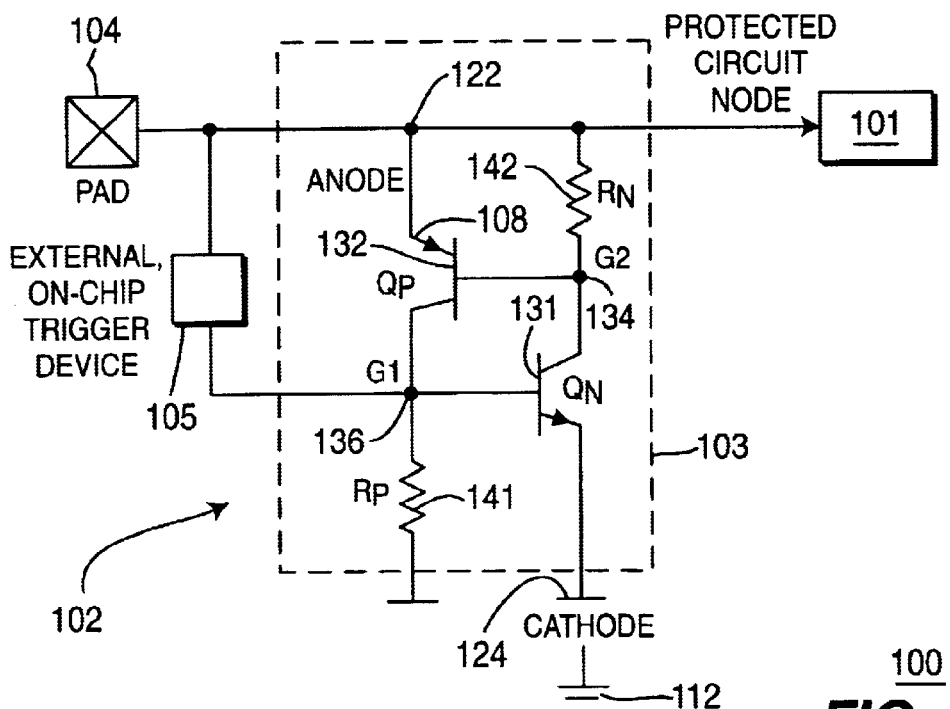

FIGS. 1A and 1B depict schematic diagram embodiments of an SCR ESD protection device 102 of the present invention. Each of the embodiments in schematic diagrams A and B illustratively depicts a portion of an integrated circuit (IC) 100 having protected circuitry (functional circuitry) 101, and an SCR ESD protection device 102 coupled to a pad 104 of the protected circuitry 101. Although a single pad 104 and SCR ESD protection device 102 is illustratively shown in the schematic drawings, one skilled in the art will appreciate that additional ESD protection devices 102 may be coupled to other pads (e.g., I/O pads) 104 for the functional circuitry 101 of the IC 100, as required.

The ESD protection device 102 comprises a SCR 103 coupled between the pad 104 and ground 112, with an external on-chip triggering device 105 coupled to the SCR 103. The triggering device 105 and SCR 103 together serve as an electrostatic discharge protection device 102 for the circuitry (i.e., functional circuitry) 101 of an integrated circuit (IC) 100. In particular, the SCR 103, in conjunction with the triggering device 105, protects the IC circuitry 101 from electrostatic discharges (ESD) that may occur at the pad 104 of the IC circuitry 101. When turned on, the SCR 103 functions as a shunt to redirect any ESD currents from the pad 104, through an anode 122 and cathode 124 of the SCR 103, to ground 112. The trigger device 105 turns on, that is "triggers" the SCR 103, to quickly dissipate such over-voltage ESD condition.

It is noted that the configuration of the SCR 103, with regard to the pad 104, ground 112, and the protected circuitry 101 is the same for both embodiments shown in FIGS. 1A and 1B. Only the coupling of the triggering device 105 to the SCR 103 differs between the schematic diagrams of FIGS. 1A and 1B.

Referring to the exemplary schematic diagram of FIG. 1A, the SCR protection device 102 includes a PNP transistor QP 132 and an NPN transistor QN 131. Specifically, an anode 122 of the SCR 103 is connected to the pad 104 and optionally to a first side of a resistor RN 142. The resistor $R_N$ 142 is used to suppress unintended triggering at low currents. Additionally, the anode 122 is coupled to an emitter 108 of the PNP transistor QP 132, which is parallel to the shunt resistor $R_N$ 142. Optionally, a number of serial diodes $D_S$ (not shown) may be coupled between the anode 122 and the emitter 108 of the PNP transistor QP 132. The serially connected diodes $D_S$ (typically 1–4 diodes) are optionally provided to increase the holding voltage of the SCR 103 as may be required to fulfill latch-up specifications.

A first node 134 includes the base of the PNP transistor QP 132, the other side of the resistor $R_N$ 142, and the collector of a NPN transistor QN 131. Additionally, the collector of the PNP transistor QP 132 is connected to the base of the NPN transistor QN 131, as well as to one side of a resistor $R_P$ 141, which forms a second node 136. The other side of resistor $R_P$ 141 is connected to a third node 124, which is coupled to ground 112. The resistor $R_P$ 141 is used to suppress unintended triggering at low currents, such as leakage currents. Furthermore, the emitter of the NPN transistor QN 131 is also connected to the grounded third node 124 and functions as a cathode of the SCR 103.

Those skilled in the art will appreciate that the resistors 141 and 142 can control the total resistance to ground 112, and thus control triggering and holding current of the SCR 103. Furthermore, any leakage currents from the trigger device 105 are shunted to ground 112 via the path through this resistor 141.

The triggering device 105 in the schematic diagram of FIG. 1A is an external on-chip trigger device 105 that is coupled between the first node 134 and ground 112. Specifically, the trigger device 105 is coupled to the base of the PNP transistor QP 132, which is commonly designated as a second gate G2 of the SCR 103. In an alternate embodiment shown in FIG. 1B, the triggering device 105 is coupled between the pad 104 and the second node 136. Specifically, the trigger device 105 is coupled to the base of the NPN transistor QP 131, which is commonly designated as a first gate G1 of the SCR 103. In either embodiment, the trigger device 105 is considered "external" to the SCR 103, since the trigger device 105 does not have any structural components that are integrated (i.e., shared by) the structural components of the SCR 103. A further aspect of the invention is to provide SCR triggering via various embodiments of external on-chip triggering diodes utilizing a HBT structure, as discussed with regard to FIGS. 5–9. It is noted that the triggering of the SCR is also possible by using internal trigger mechanisms such as the breakdown of the junction formed between the N-epitaxial layer and the first p-doped (p-base) region, as illustrated below in FIG. 2.

Figure 2:
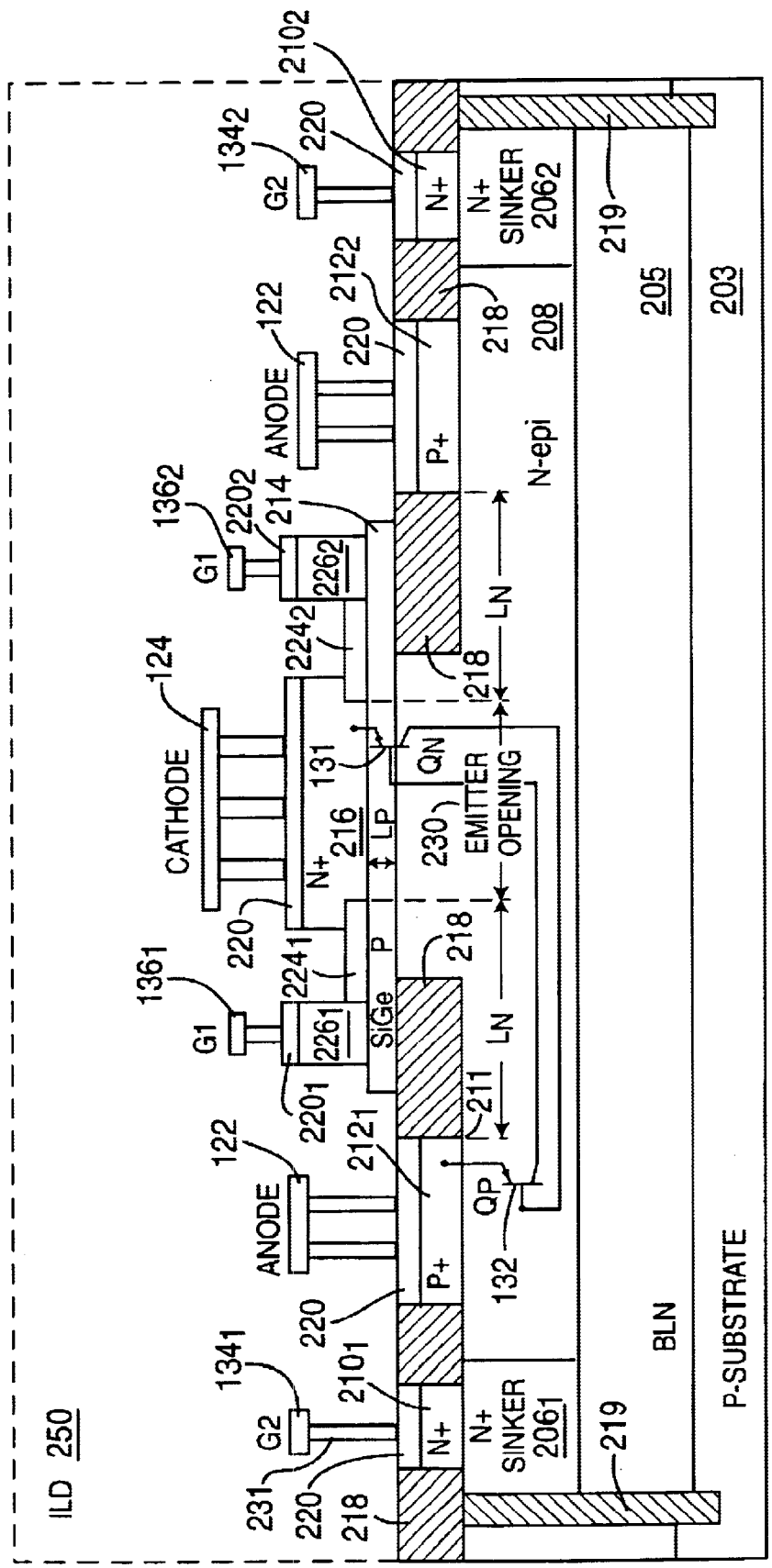
FIG. 2 depicts a cross-sectional view of a first embodiment of the SCR ESD protection device of FIGS. 1A and 1B.
Figure 3:
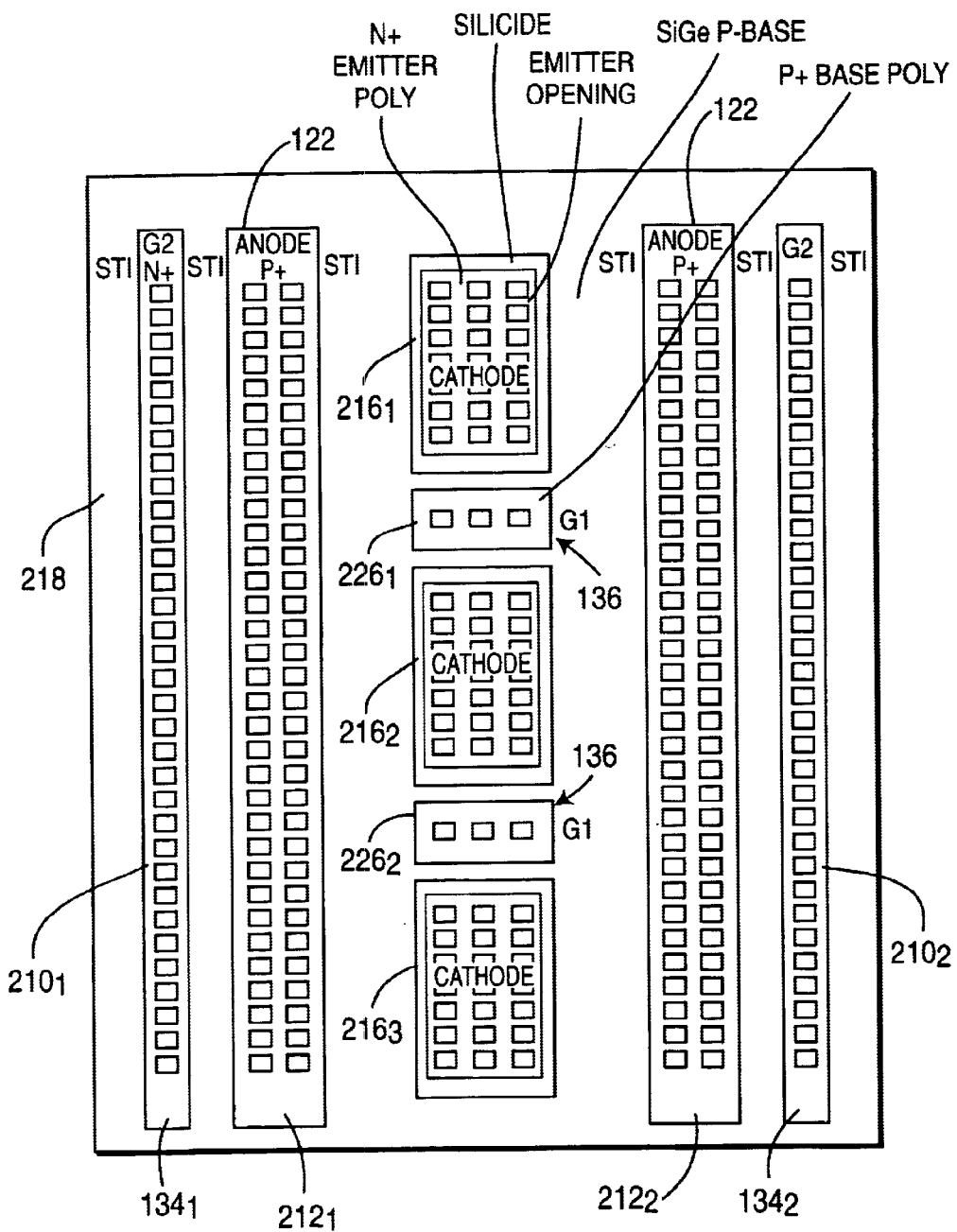
FIG. 3 depicts a top view of a second embodiment of the SCR ESD protection device of FIGS. 1A and 1B.
Figure 4:
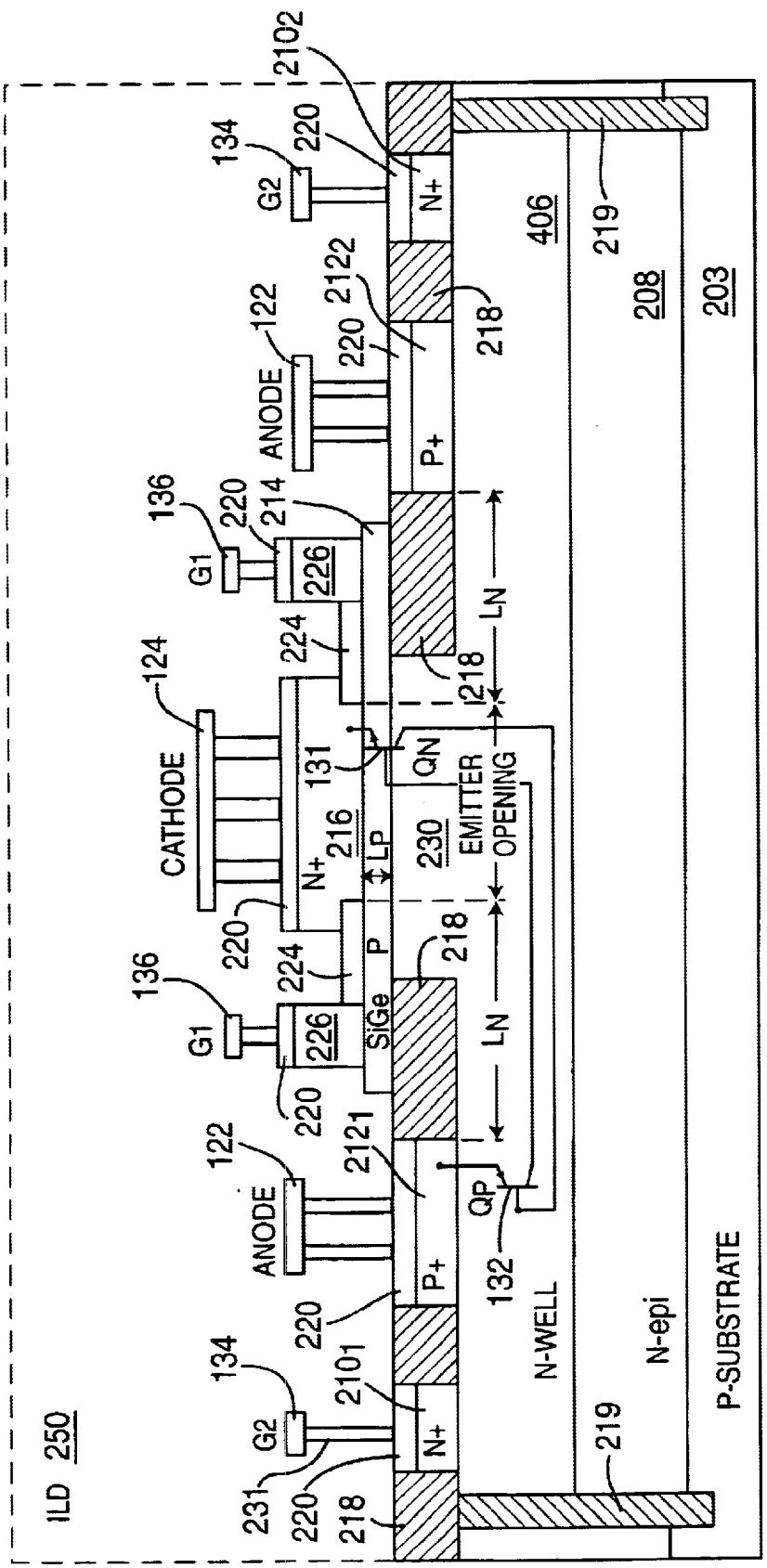
FIG. 4 depicts a cross-sectional view of a third embodiment of the SCR ESD protection device of FIGS. 1A and 1B.

Various embodiments depicting the structure and doping materials of the SCR are shown and discussed with regard to FIGS. 2–4. For example, one inventive feature of the SCR of the present invention is the structural formation comprising a lateral bipolar transistor and a vertical bipolar transistor to form the SCR 103. Another inventive aspect of the invention pertains to the utilization of silicon germanium (SiGe) technologies in the SCR 103 to form a vertical heterojunction bipolar transistor (HBT).

FIG. 2 depicts a cross-sectional view of a first embodiment of a SCR ESD protection device of FIGS. 1A and 1B. The illustrative schematic diagram in FIG. 2 represents the components of the SCR 103, which correspond to the schematic diagram embodiments in FIGS. 1A and 1B. That is, FIG. 2 is illustrated and discussed as a SCR formed by a lateral bipolar transistor and a vertical bipolar transistor. It is noted that the trigger devices 105 are not depicted on the cross-sectional view of FIG. 2.

In particular, the lateral bipolar transistor is formed by the PNP transistor QP 132, while the vertical bipolar transistor is formed by the NPN transistor QN 131. The SCR protection device 103 comprises a stack of doped layers that include a P-type substrate 203, a buried N-doped layer (hereinafter referred to as a "buried layer N-type" (BLN)) 205, a N-doped layer (e.g., a lightly doped or N-epitaxial layer) 208, and at least one N+ sinker region 206. The SCR ESD protection device also comprises a first P doped region 214, at least one second P doped region 212, a first N+ doped poly silicon region 216, at least one second N+ doped region 210.

On the silicon P-substrate 203, is formed the heavily N-doped (e.g., $2 \times 10^{19}$ atoms/cm$^{-3}$) and thus highly conductive BLN 205. The lightly N-doped layer 208 (e.g., $10^{16}$ to $10^{17}$ atoms/cm$^{-3}$, and hereinafter illustratively termed "N-epitaxial" layer 208) is formed over the BLN 205. Lateral isolation of the N-epitaxial layer 208 is provided by a ring of deep trench isolation (DTI) 219. That is, a deep trench is etched around the active device region and filled with an isolating oxide, such as silicon dioxide (SiO$_2$), among others.

Deep highly N-doped regions (i.e., N+ sinker regions) 206$_1$ and 206$_2$ (collectively N+ sinker regions 206) are formed proximate the DTI 219 by implanting N-type dopants having a doping concentration of about $10^{18}$ atoms/cm$^{-3}$. As such, the lightly N-doped layer 208 is formed over the BLN 205 and between the N-sinker regions 206. The N+ sinker regions 206 are used to form an ohmic connection from N+ diffusion regions 210 down to the BLN 205.

Shallow trench isolation (STI) 218 is used to separate regions that are designated for formation (e.g., implantation/diffusion) of the high-doped regions (e.g., second N+ and P+ doped regions 210, 212,) as illustrated in FIG. 2. In particular, shallow trenches are etched in specific areas, and an insulator material (e.g., silicon dioxide (SiO$_2$) and the like) is deposited in the shallow trenches. The regions 210 and 212 may also be separated by other techniques known in the art that are beneficial to the SCR operation, as described in commonly assigned U.S. patent application Ser. No. 10/007,833, filed Nov. 5, 2001, which is hereby incorporated by reference in its entirety.

As illustratively shown in FIG. 2, the SCR 103 is preferably formed symmetrically, such that the cathode 124 is substantially centered between the two P+ regions 212$_1$ and 212$_2$ forming the anode 122, where each P+ anode region 122 is on opposing sides of the cathode 124. The symmetry is preferably provided as a technique to save real estate on the IC 100, and thus provide a more compact implementation and less area overhead, instead of just providing a single large P+ region 212 to serve as the anode 122. Further, the symmetry allows for more efficient geometric layouts that promote increased current flow.

It is noted that N+ and P+ implant and annealing steps are conducted following the STI region formations to form the high-doped N+ and P+ regions 210 and 212, respectively. The implantations are provided through separate photo masks for the N+ and P+ to allow the dopants to penetrate only into the dedicated regions of the IC 100. Referring to FIG. 4, the areas surrounding the cathode regions 216, first gate regions 226, anode regions 212, and second gate regions 210 are shown as being covered by the insulative STI material during the processing.

During implantation, the second N+ regions (N+ diffusion regions) 210$_1$ and 210$_2$ (collectively second N+ regions 210) are provided over each N-sinker region 206, which form the second gate G2 134. Additionally, the second P+ region (P+ diffusion region) 212$_1$ and 212$_2$ (collectively second P+ regions 212) are provided over the N-epi layer 208 to form the anode 122. As shown in FIG. 2, the STI 218 separates and electrically isolates the second N+ regions 210 from the second P+ regions 212, as well as the second P+ regions 212 from the first P+ region 214.

The vertical NPN transistor QN 131 is formed by the first P doped region 214 formed over the N-epi layer 208 and the first N+ poly silicon region 216 formed over the first P doped region 214. In particular, the first N+ poly silicon region (N+ emitter) 216 and the first P doped region 214, respectively form the emitter and base of the vertical NPN transistor QN 131. Furthermore, the N-epi layer 208, N-sinker regions 206, and BLN 205 together form the collector of the vertical NPN transistor QN 131. The first N+ poly silicon region (emitter) 216, as its name implies, is typically a N+ doped poly silicon material that also forms the cathode 124 of the SCR 103.

FIG. 3 depicts a top view of a second embodiment of the SCR ESD protection device of FIGS. 1A and 1B. FIG. 3 illustrates one embodiment of many possible layouts of the SCR components to conserve real estate on the IC 100 and enhance performance by minimizing the SCR transistor base widths. Many aspects shown in FIG. 3 may be applied to the embodiments depicted in FIGS. 2 and 4 herein. For example, the cathode 124 is formed by a plurality of the first N+ poly silicon regions (e.g., 216$_1$ through 216$_3$, collectively N+ regions 216), which are linearly interspersed over the first P doped region 214. Furthermore, the trigger gate G1 formed by the P+ poly silicon regions 226 are interspersed and aligned with the plurality of second N+ poly silicon regions 216 over the first P doped region 214.

Similarly, the anode 122 may be formed by a plurality of the second P+ poly silicon regions (e.g., 212$_1$ and 212$_2$) which are linearly interspersed over the N-epi layer 208. Moreover, the trigger gate G2, which is formed by the second N+ doped region 210, may also comprise a plurality of second N+ doped regions (e.g., 210$_1$ and 210$_2$) that are interspersed and aligned with the plurality of second P+ poly silicon regions 212$_1$ and 212$_2$ over the N-epi layer 208.

Referring to FIG. 2, the lateral PNP transistor QP 132 is formed by at least one second P+ doped region (e.g., 212$_1$ and 212$_2$, collectively 212), the N-epi region 208 collectively with the BLN 205, and the first P doped region 214. The second P+ doped region 212, the N-epi region 208 collectively with the BLN 205, and the first P doped region 214 respectively form the emitter, base, and collector of the lateral PNP transistor QP 132. The second P+ doped region 212 is typically a P+ doped poly silicon material, however, in an alternative embodiment, the second P+ doped region 212 is fabricated from a P+ doped SiGe material, as discussed below in further detail. It is noted that the first P doped region 214 serves dual functions as forming the collector of the lateral PNP transistor QP 132, as well as the base of the vertical NPN transistor QN 131. Likewise, the N-epi layer 208 and the BLN 205 collectively serve dual functions as forming the collector of the vertical NPN transistor QN 131, as well as the base for the lateral PNP transistor QP 132.

The first gate G1 136 is formed by at least one P+ base poly silicon region 226, which is respectively disposed over first P doped region 214. In the embodiment shown in FIGS.

2 and 3, the first gate 136 illustratively comprises a plurality of P+ base poly regions (e.g., regions $226_1$ and $226_2$) located on opposing sides of the first N+ cathode poly silicon region 216.

For example, referring to FIG. 3, the first gate regions $226_1$ and $226_2$ are respectively disposed proximate and between each of the plurality of first N+ emitter poly silicon regions 216. That is, the first gate regions $226_1$ and $226_2$ are respectively disposed between the first N+ emitter regions $216_1$ and $216_2$, as well as between the first N+ emitter poly silicon regions $216_2$ and $216_3$. Providing multiple, interspersed first gate regions 226 in line with the N+ emitter/cathode poly silicon regions 216 allows the anode regions (i.e., second P+ doped regions 212) to be placed closer to the cathode such that the lateral dimensions $L_N$ may be reduced for faster turn-on of the SCR 103, as discussed below in further detail with regard to FIG. 2.

Insulative regions $224_1$ and $224_2$ (e.g., silicon dioxide ($SiO_2$)) isolate the first N+ emitter poly silicon region 216 from the P+ base poly silicon regions 226 of the first gate 136. In particular, the insulative regions $224_1$ and $224_2$ are disposed over the first P doped region 214 and between the first N+ emitter poly silicon region 216 and the P+ poly silicon regions $226_1$ and $226_2$. It is noted that the first N+ emitter poly silicon region 216 is also formed over a portion of the insulative regions $224_1$ and $224_2$. Furthermore, the portion of the first N+ emitter poly silicon region 216 positioned between the insulative regions $224_1$ and $224_2$ define a window (i.e., "emitter opening") 230 therebetween, as is discussed in further detail below.

Optionally, a silicide layer 220 is formed over the first N+ poly silicon region 216 (cathode), the first gate regions 226 (G1), the second gate regions, 210 (G2), and the second P+ regions 212 (anode). In particular, a metal layer (e.g., using cobalt, titanium, and the like) is deposited on the surface of the IC 100. During a thermal treatment, a highly conductive alloy is formed between the metal and the silicon ("silicide"). The silicide layers 220 serve as a conductive bond between the high-doped regions (216, 210, 212, and 226) and their respective metal contacts, which provide external connectivity at the anode 122, cathode 124, first gate 136, and second gate 134 of the SCR 103.

To complete processing of the SCR of the present invention, oxide layers known as Inter-Level Dielectric (ILD) 250 (drawn in phantom) are deposited over the doped regions. An etching process is performed to form the contact holes, which are subsequently filled with metal to form the metal contacts. Several contact holes may be placed in rows over the emitter opening 230 to increase the maximum current. It is noted that that the total number of contact holes over the anode 122 (i.e., second P+ regions 212) approximately matches the number of contact holes in the cathode 124 (i.e., first N+ poly silicon region 216).

In one embodiment of FIG. 2, all of the P and N-type regions (210, 212, 214. and 216) are formed from a silicon-only lattice structure. In particular, the first and second P doped regions 214 and 212 have a doping concentration of about $10^{21}$ atoms/cm$^{-3}$. The first N+ poly silicon region (emitter) 216 and second N+ region (second gate) 210, as well as the P+ poly silicon regions 226, have doping concentrations of about $10^{21}$ atoms/cm$^{-3}$. The BLN layer 205 has a doping concentration of about $10^{19}$ atoms/cm$^{-3}$, the N+ sinker region 206 has a doping concentration of about $10^{20}$ atoms/cm$^{-3}$, and the N-epitaxial layer 208 has a doping concentration in the range of $10^{16}$ to $10^{17}$ atoms/cm$^{-3}$, which is the lowest doping concentration of the protection device 103.

In a second embodiment of FIG. 2, the first P doped region 214 comprises a silicon germanium (SiGe) lattice structure. In particular, the first P doped region 214 is formed from silicon and Germanium. The concentration is gradually increased with the depth of the layer from 0% to up to a peak concentration of approx. 10–13%. The silicon concentration reduces respectively from 100% down to approx. 90–87%. Furthermore, the SiGe is doped with Boron at a concentration of about $10^{19}$ atoms/cm$^{-3}$. The remaining layers and regions of the protection device 102 are the same as discussed above. The utilization of the silicon germanium lattice structure is particularly suited for circuitry operating under RF applications, such as wireless chips and devices.

The implementation of the SiGe HBT (i.e., vertical NPN transistor 131) has a very low junction capacitance, which makes the SCR suitable for the high (RF) frequencies, since the parasitic junction capacitance of the SCR 103 may be minimized by having a low junction capacitance while providing a very high level of ESD hardness. Specifically, the junction area between the base and collector (i.e., SiGe P doped region 214 and the N-epi region 208 region is defined by the emitter opening, and therefore is minimized. Moreover, the N-epi layer 208 (collector) is very lightly doped as compared to a standard non-epi semiconductor processes. The typical junction capacitance is 0.7 femto Farad per square-micron area (compared to 1.6 femto Farad per square-micron for P+/N-well per square-micron area). For other parasitic capacitances such as the one between the BLN and the P-substrate or at the sidewalls (DTI) of the device, all capacitance values have been already minimized to meet the high frequency requirement for the functional HBT devices.

In a third embodiment of FIG. 2, the first and second P doped regions 214 and 212 are each fabricated from SiGe, and are doped with Boron at a concentration of about $10^{19}$ cm$^{-3}$. The joint formation of the first and second P doped regions 214 and 212 allows for easier fabrication processing, thereby reducing costs. Furthermore, the performance of this third embodiment is substantially the same as the second embodiment in which the second P doped region 212 is formed from only a silicon-based lattice structure.

One objective of the present invention is to increase the speed in which the SCR 103 turns on. Decreasing the turn on time of the SCR 103 is realized by two particular differences over SCRs 103 that are formed by a pair of lateral bipolar transistors in the prior art. One difference over the prior art is a reduction in the size of the respective base regions of the transistors QN 131 and QP 132 in the SCR 103, which influences the turn on time of the SCR 103, as well as the current gains β of the transistors 131 and 132. The increased transistor current gains β help ensure that enough current is provided to forward bias the bases of each transistor QN 131 and QP 132, and thereby quickly and reliably activate the SCR 103.

In FIG. 2, the dimensions $L_P$ and $L_N$ represent the respective base lengths of the vertical NPN transistor QN 131 and the lateral PNP transistor QP 132. In the embodiments where the first P+ doped region 214 comprises a crystalline structure of silicon and germanium, the base length $L_P$ of the NPN transistor QN 131 is in the range of 15–50 nm.

The base length $L_N$ is measured from the edge 211 of the second P+ region 212 to the emitter opening 230. As discussed above, the emitter opening 230 is defined as the N-epi region located below the first P+ region 214 that is not covered by the insulative material (e.g., $SiO_2$) 224. The size of the emitter opening 230 determines the cross-section for the current flow. In one embodiment, the base length $L_N$ of the PNP transistor QP 132 is in the range of 1.0 to 2.0 microns.

The SCR turn-on time is related to the combined turn-on times of the each transistor QN 131 and QP 132. The turn-on times of the bipolar transistors 131 and 132 are proportionally related to the square of their respective base widths. Accordingly, since the base width ($L_P$) of the NPN bipolar transistor has been reduced by virtue of implementing the vertical NPN transistor QN 131, the turn on time of the SCR has also been greatly reduced as compared to an SCR having a pair of laterally formed transistors.

Further, for the embodiments utilizing the SiGe lattice structure in the base of the vertical NPN transistor QN 131, the SiGe heterojunction transistor allows for control of the electrons and holes independently. As a result, the overall gain-bandwidth product ($f_{max}$), which characterizes the maximum frequency of operation, may be improved. The overall gain-bandwidth product ($f_{max}$) may be improved by two fabrication methods. The first fabrication method is to provide a high germanium concentration in a uniform base, while a second method is to provide a low germanium concentration in a graded base.

In the first fabrication method, the resistivity in the base layer is greatly reduced. In particular, the heterojunction at the base-emitter interface of the NPN transistor QN 131 reduces hole injection into the emitter, such that the current gain remains high. The speed of the device, as measured by the emitter-collector transit time is equivalent to that of a conventional bipolar transistor, but the gain-bandwidth product is greatly increased due to the large reduction in base spreading resistance. This first fabrication method is most suitable for power applications.

In the second fabrication method (low germanium concentration in a graded base), the germanium varies from very low concentration at the emitter-base junction to around 10% at the collector-base junction of the NPN transistor QN 131. In this case, the current gain is only slightly affected. However, the speed of the device, as measured by the emitter-collector transit time, is increased due to a built-in field generated by the Germanium concentration gradient across the base. Moreover, the base-width modulation (modulation of the base-collector depletion layer width caused by variations in the collector-base voltage) is diminished, however the high current gain fall-off is increased due to the heterojunction at the collector-base interface. Accordingly, this second fabrication method is most suitable for small signal applications. The latter technique has the drawback of a higher resistivity in the base layer. Therefore, the ESD capability in the mentioned prior art devices is relatively low.

FIG. 4 depicts a cross-sectional view of a third embodiment of a SCR ESD protection device of FIGS. 1A and 1B. The embodiment shown in FIG. 4 is the same as the embodiment of FIG. 2, except that the BLN 205 and N+ sinker regions are omitted, and an N-well 406 is formed over the N-epi layer 208.

In particular, the N-epitaxial layer 208 is formed over the P-substrate 203, and the N-well 406 is diffused into the N-epi layer 208 and laterally isolated by the DTI 219. The N-well 406 has an N-doping concentration of about $10^{18}$ atoms/cm$^{-3}$, which is less than the BLN 205. The first P doped regions 214, second P doped regions 212, second N+ doped regions 210, and first N+ doped region 216 are formed over the N-well 406 as discussed above with regard to FIG. 2. It is further noted, that the first and second P doped regions 214 and 212 may comprise only silicon doped material, or SiGe, as also discussed above with regard to FIG. 2.

The omission of the BLN 205 and inclusion of the N-well 406 prevents any possible deterioration of the current gain in the distributed lateral PNP transistor QP 132 of the SCR 103. In particular, the deterioration of the current gain, which is due to the high doping concentrations of the BLN 205, may offset the advantages of having a low resistive current path through the BLN 205. Accordingly, the diffused N-well 406 forms the base of the lateral PNP transistor 132 (as well as the collector of the vertical NPN transistor 132), with minimal reduction in current gain β.

It is further noted that in an alternate embodiment of FIGS. 2–4, an asymmetric layout may also be implemented. In the asymmetric layout, only a single second P+ doped region 212 (e.g., 212$_1$) is utilized, as well as a single second N+ doped region 210 forming the first gate and a single P base poly region 226 forming the second gate. As such, the anode 122 defined by the P+ region 212$_1$ is larger than the symmetrical embodiment, since the number of contact holes in the anode 122 must substantially match the number of contact holes in the cathode 124. Furthermore, the DTI ring of insulative material is formed under the STI region approximately where the second P+ base poly silicon region 226$_2$ is formed. Thus, everything to the right of the ring is omitted from the SCR 103. ESD protection performance of an asymmetrical SCR of the present invention is comparable with regard to current gain and SCR turn-on time as to the performance of the preferred symmetrical SCR layout.

The SCR of the present embodiments provide a vertical NPN transistor QN 131 with a distributed (i.e., lateral) PNP transistor QP 132. The vertical NPN transistor has reduced base length $L_P$ and vertical current flow from the emitter to the collector, which increases the current gain, current flow, and turn-on time, as compared to a SCR having distributed (i.e., lateral) NPN and PNP transistors.

In instances where the base of the NPN transistor 131 comprises Silicon-Germanium, the SCR 103 is vertically isolated from the P-substrate 203 by the a reverse diode formed by the BLN 205 and P-substrate 203 junction, as well as laterally by the DTI 219. Accordingly, the SCR 103 may be used as an ESD protection device in various situations usually encountered for ICs used in RF applications, such as wireless devices. In such RF circuits, signals may swing above the positive supply voltage or below the negative supply voltage. Protection devices that are isolated from the P-substrate 203 are beneficial in both instances, since only they can comply with the circuit requirement that no conductive path opens to the supply or ground line if such an overshoot or undershoot of the signal occurs.

Additionally, it is noted that in some ESD protection applications, the gates may be omitted completely, or only a single gate or both gates (i.e., gate G1 or G2) may be required based upon the circuitry of the IC 100 to be protected. For example, referring to FIG. 1A, only the second gate G2 136 is used to trigger the SCR 103 when protecting against an ESD event occurring at the pad 104. As such, the P+ poly silicon base regions 226 that form the first gate G1 would not be required. Utilizing only the second gate G2 134 avoids any potential heating issues that may occur by using the first gate G1 136, due to lateral (trigger) current flow through the SiGe base 214 of the NPN transistor 131.

Similarly, referring to FIG. 1B, only the first gate G1 134 is used to trigger the SCR 103. As such, the N+ regions 210 and N+ sinker regions 206 that form the second gate G2 would not be required. Eliminating an unused gate provides for a more compact layout of the ESD protection device 102. Furthermore, the trigger gate G1 136 is a short and direct way of injecting the trigger current into the highly effective HBT base region, as well as lessening the trigger speed of the SCR 102 as compared with using the second gate G2 134 to trigger the lateral PNP transistor 132.

However, both gates G1 and G2 134 and 136 may also be implemented to provide connectivity to independent triggering devices 105. Specifically, there are instances where each gate may be used to trigger the SCR 103 and protect against different types of ESD events. Such ESD events may include positive or negative ESD events occurring at a particular pad, ESD events occurring at different components of the functional circuitry 101, among others.

As mentioned above, in yet another embodiment of the SCR103, the trigger gates may be eliminated entirely. Elimination of both gates allows for a more compact IC layout because the N+ sinker region 506, the N+ G2 region 510, and the P+ base poly silicon 522 are no longer required. Omission of both gates G1 and G2 is applicable where the trigger voltage of the SCR can be determined by the avalanche breakdown of the heterojunction between the N-epi and the P-base layer (SiGe).

Figure 5A:
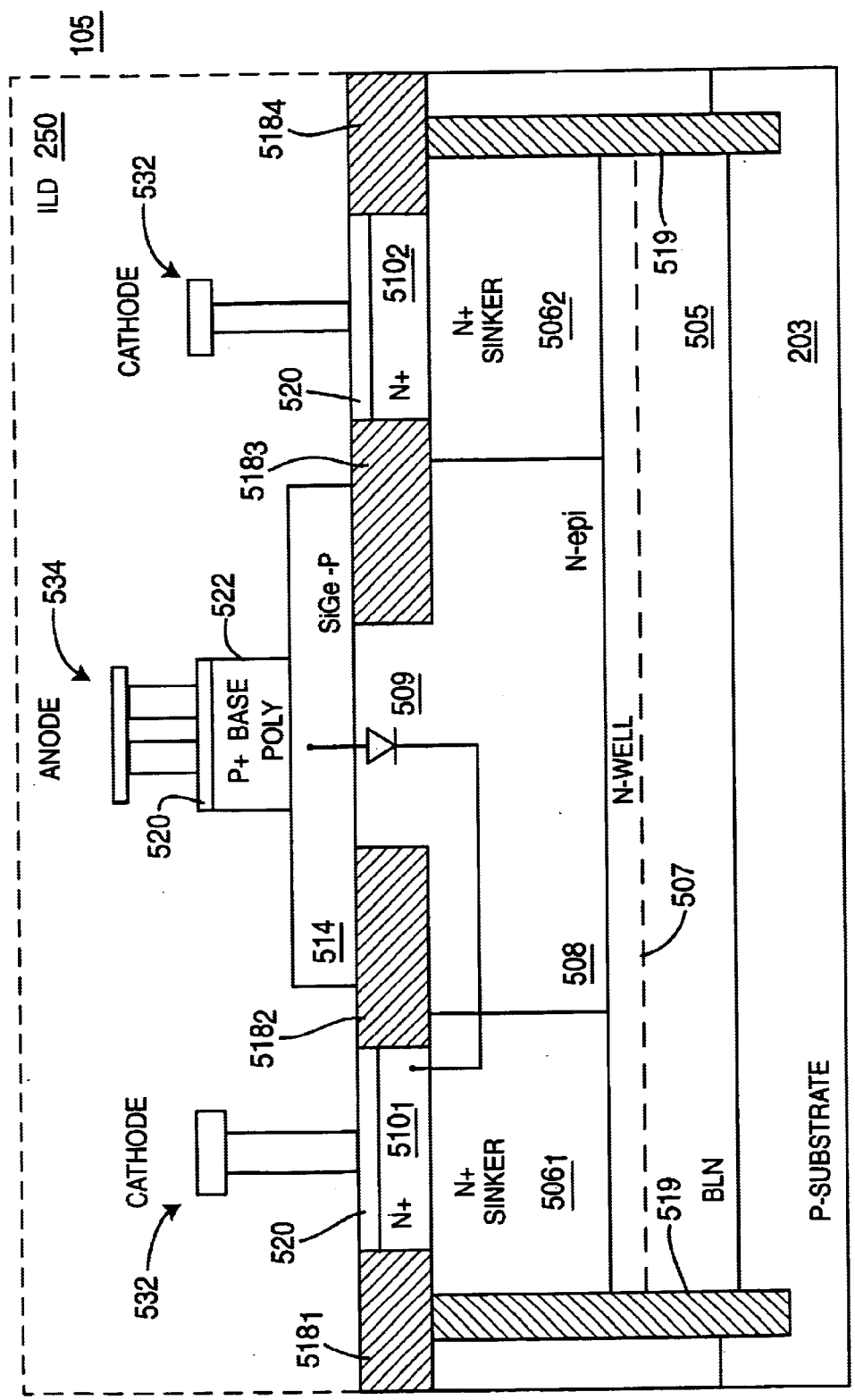
FIGS. 5A and 5B depict cross-sectional views of a first embodiment of a trigger device of the present invention.
Figure 5B:
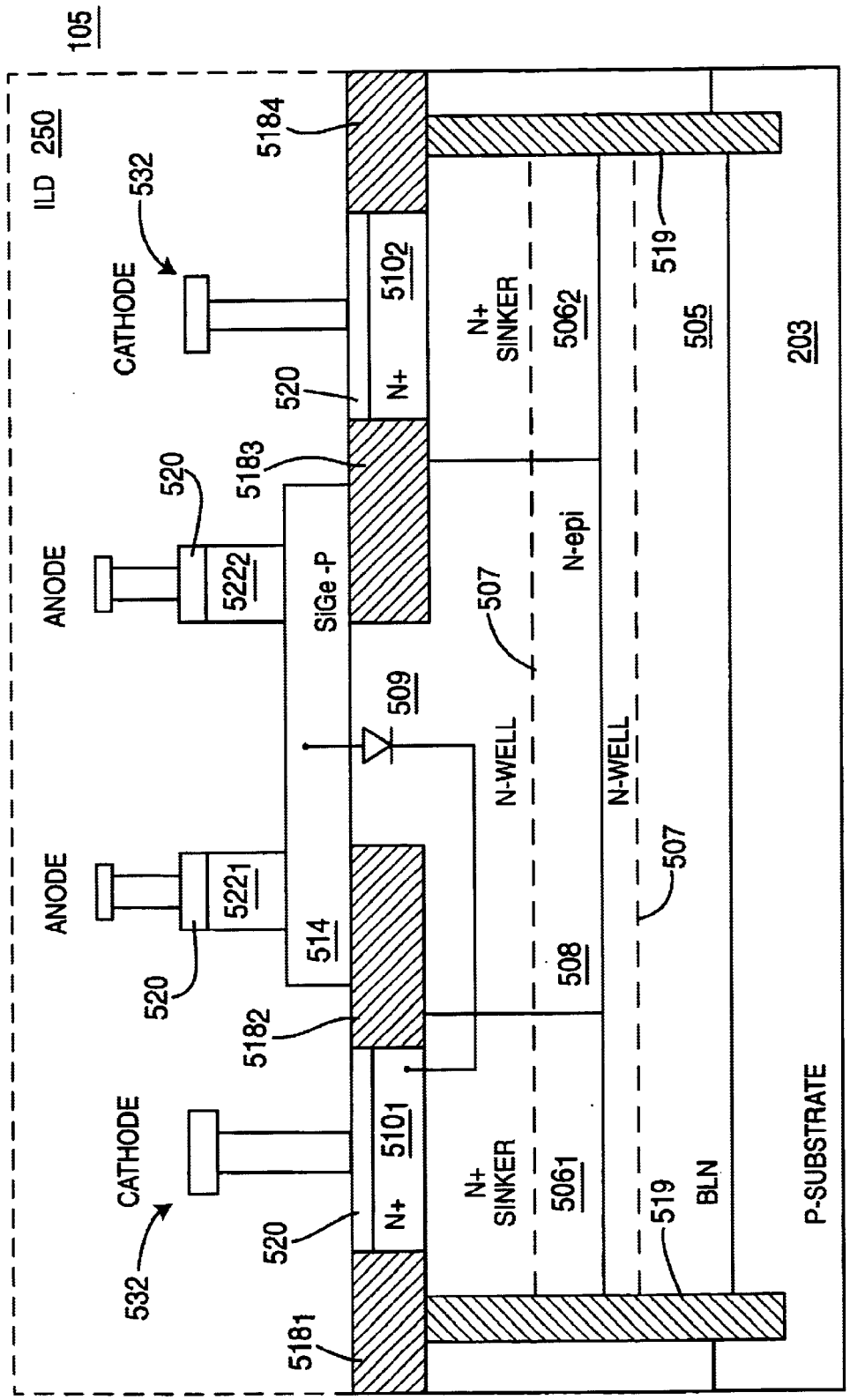

FIGS. 5A and 5B depict cross-sectional views of a first embodiment of a diode trigger device 105. As mentioned above, the SCR is turned on (i.e., "triggered") by an external on-chip trigger device 105. The trigger device 105 is external to the SCR, since neither the SCR 103 nor the trigger device 105 has any integrated or shared components. The triggering devices discussed in FIGS. 5–9 are utilized for SCR embodiments utilizing the SiGe lattice structure in the first P doped region 214. That is, the trigger devices 105 of FIGS. 5–9 may be used in instances where the vertical NPN transistor 131 is a heterojunction bipolar transistor (HBT).

The exemplary triggering device 105 (of both FIGS. 5A and 5B) is a heterojunction diode (HBD) triggering device 105 that utilizes a collector (C) to base (B) breakdown of the heterojunction transistor (HBT). In particular, the HBD trigger device 105 comprises a stack of doped layers that include a P-type substrate 203, a buried N-doped layer (hereinafter referred to as a "buried layer N-type" (BLN)) 505, an N-epitaxial layer 508, and at least one N+ sinker region 506, as discussed above with regard to the SCR 103. The HBD trigger device 105 also comprises a SiGe doped region 514, at least one N+ diffusion region 510, and at least one P+ poly base region 522.

The structure of the trigger device 105 is similar in many aspects to the structure of the SCR 103. In particular, on the silicon P-substrate 203, is formed the highly conductive BLN 505. The N-epitaxial layer 508 is formed over the BLN 205. Lateral isolation of the N-epi layer 508 is provided by a ring of deep trench isolation (DTI) 519, such as silicon dioxide (SiO$_2$), among others.

Deep highly N-doped regions (i.e., N+ sinker regions 506$_1$ and 506$_2$ (collectively N+ sinker regions 506) are formed proximate the DTI 519 by implanting N-type dopants as discussed above with regard to the SCR 103. As such, the N-epi layer 508 is formed over the BLN 205 and between the N+ sinker regions 506. The N+ sinker regions 506 are used to form a low-ohmic connection from N+ diffusion regions 510 down to the BLN 505. Shallow trench isolation (STI) 518 is used to separate regions that are designated for formation (e.g., implantation) of the high-doped regions (e.g., N+ diffusion region 510 and SiGe P-doped region 514) as discussed above with regard to the SCR 103.

It is noted that N+ implant and annealing steps are conducted following the STI region formations to form the high-doped N+ regions 510. During implantation, the N+ diffusion regions 510$_1$ and 510$_2$ (collectively, N+ diffusion regions 510) are provided over each N+ sinker region 506, which form the cathode 532 (equivalent to the collector contact of the HBT)) of the heterojunction diode.

In FIGS. 5A and 5B, STI regions 518$_1$ and 518$_2$ isolate N+ diffusion region 510$_1$, while STI regions 518$_3$ and 518$_4$ isolate N+ diffusion region 510$_2$. Moreover, N-epi layer region 509 is maintained between STI regions 518$_2$ and 518$_3$. Further, the SiGe P doped region 514 is broadly deposited over the N-epi layer region 509 and adjacent STI regions 518$_2$ and 518$_3$.

In FIG. 5A, the P+ base poly silicon region 522 is formed over the P doped region 514, which collectively form the anode 534 (equivalent to the base contact of the HBT) of the HBD 105. In one embodiment of FIG. 5A, the P+ base poly silicon region 522 is centered over the P doped region 514 and N-epi layer 508. That is, the anode 534 has direct contact over the active SiGe P doped region 514.

In FIG. 5B the P+ base poly silicon region 522 is divided into two regions 522$_1$ and 522$_2$ with each P+ base poly silicon region 522 formed laterally on the P doped region 514 and over the STI 518 formed beneath the SiGe P doped region 514. That is, the anode 534 has indirect contact to the active junction, since the P base poly silicon regions 522$_1$ and 522$_2$ are placed lateral to the active SiGe P doped region 514. In either of the embodiments, it is noted that the high-doped regions (N+ diffusion and P+ base poly silicon regions 510 and 522) may optionally be silicided 520, as discussed above with regard to the SCR 103.

It is noted that there is no emitter contact region present in the illustrative trigger device layout. Omission of the emitter contact region allows a vertical current flow through the metallization, contacts, silicided layer 520, and the P+ base poly silicon region 522, and into the thin SiGe base layer 514. That is, the SiGe P doped region (base) 514 forms the anode of the HBD 105, while the N+ diffusion regions 510$_1$ and 510$_2$, N+ sinker regions 506$_1$ and 506$_2$, and N-epi layer 508 collectively form the cathode of the HBD 105. It is further noted that the highly doped BLN 505, N+ sinker regions 506, and N+ diffusion regions 510 (including the silicide layers 520) ensure that there is a low-resistive connection to the cathode terminal 532.

The reverse breakdown of the trigger diode 105 occurs at the P-N junction between the SiGe P-base and the N-epi layer region 509 disposed thereunder. Typically, the breakdown voltage of the HBD is in a range between 6 and 9 volts. During an ESD event, once the breakdown voltage threshold is met, the trigger diode 105 conducts, and provides a trigger current to a gate (134 or 136) of the SCR 103, which triggers the SCR 103.

It is also noted that the junction capacitance is very low because the N-epi layer 508 is lightly doped (e.g., doping concentration around $10^{16}$ to $10^{17}$ atoms/cm$^{-3}$). The low level doping in the N-epi layer 508 allows the depletion layer of the diode to extend further into the silicon of the N-epi layer. A longer depletion layer width results in lower junction capacitance.

In an alternative embodiment of FIGS. 5A and 5B, an N-well region 507 (drawn in phantom) is formed in the N-epitaxial layer 508. Specifically, the N-well 507 is formed beneath the SiGe P doped region 514. In particular, the N-well 507 extends laterally between the DTI regions 519 beneath the N+ diffusion regions 510. Accordingly, the N+ sinker regions 506 are no longer required. The N-well 507 is provided to further lower the trigger voltage by increasing the doping concentration (e.g., $10^{18}$ atoms/cm$^{-3}$) at the N-side of the junction. A higher doping concentration causes a shorter depletion layer width in which the voltage drops with higher electric field strength. The latter leads to a higher avalanche multiplication factor and a lower breakdown voltage.

Figure 6:
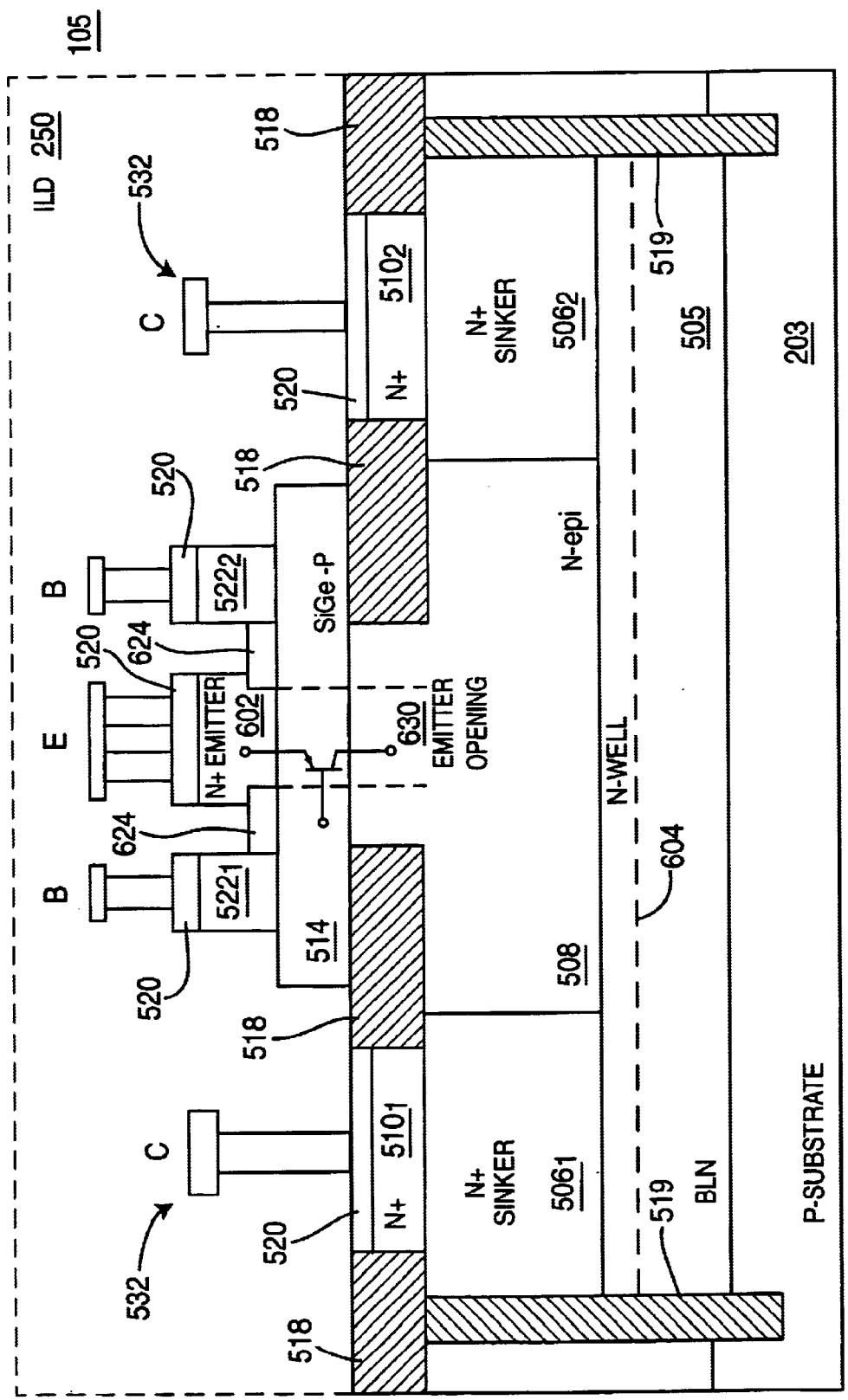
FIG. 6 depicts a cross-sectional view of a second embodiment of a trigger device of the present invention.
Figure 7:
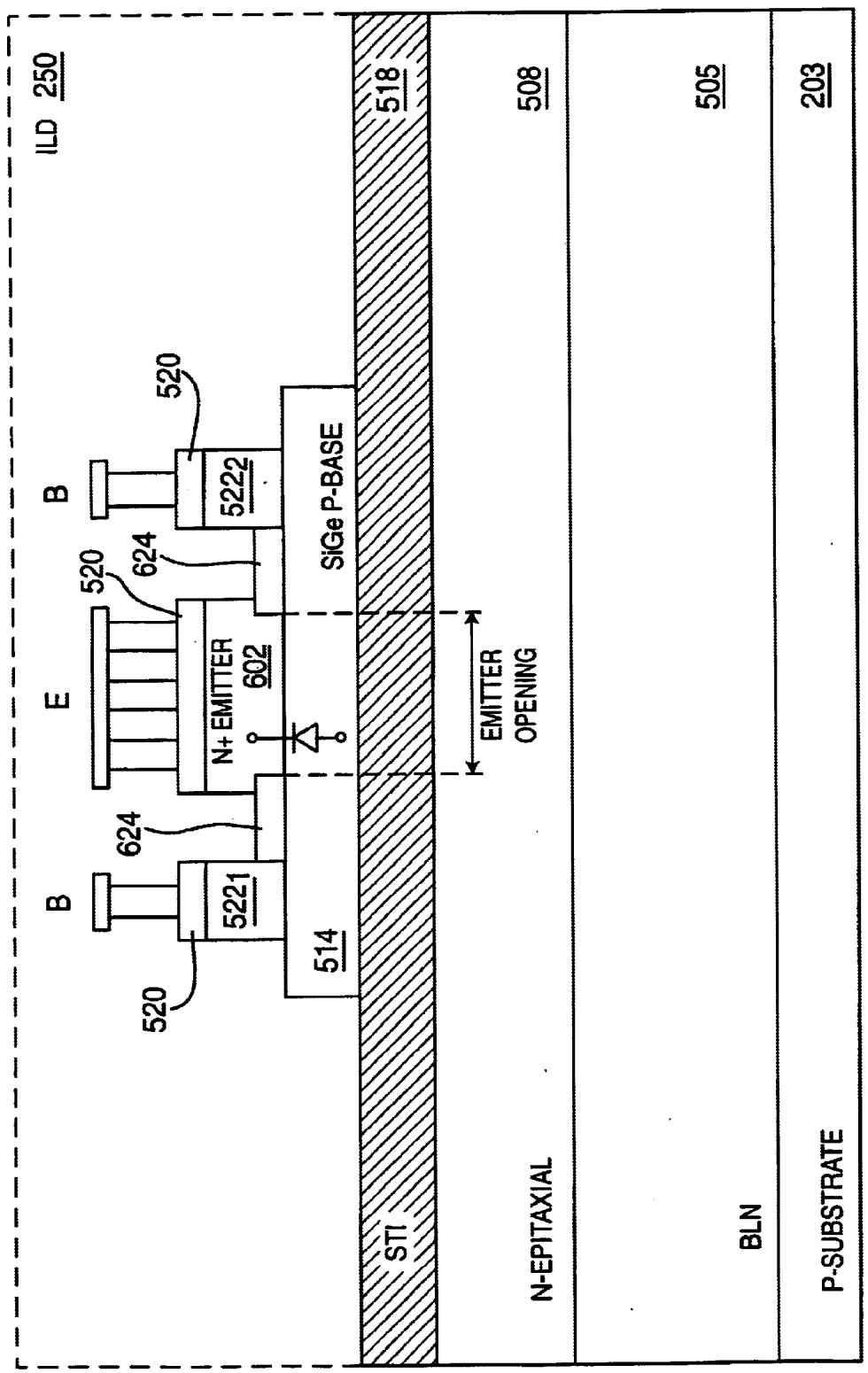
FIG. 7 depicts a cross-sectional view of a third embodiment of a trigger device of the present invention.
Figure 8A:
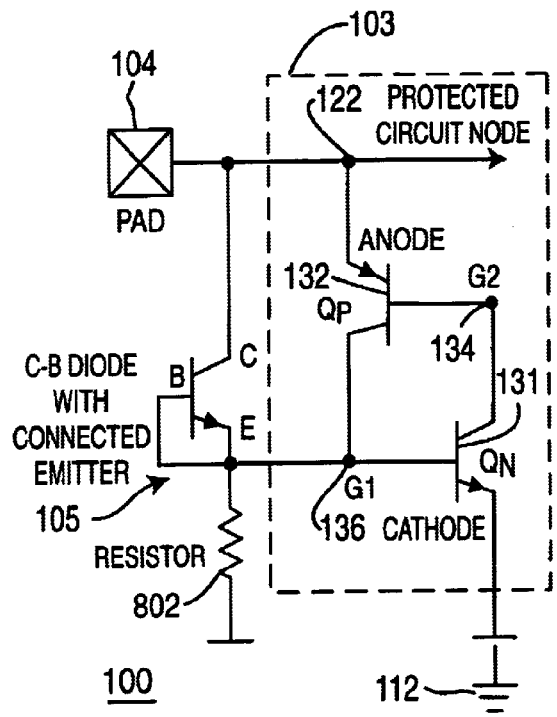
FIGS. 8A–8C depict schematic diagram embodiments of the trigger devices illustrated in FIGS. 6 and 7.
Figure 8B:
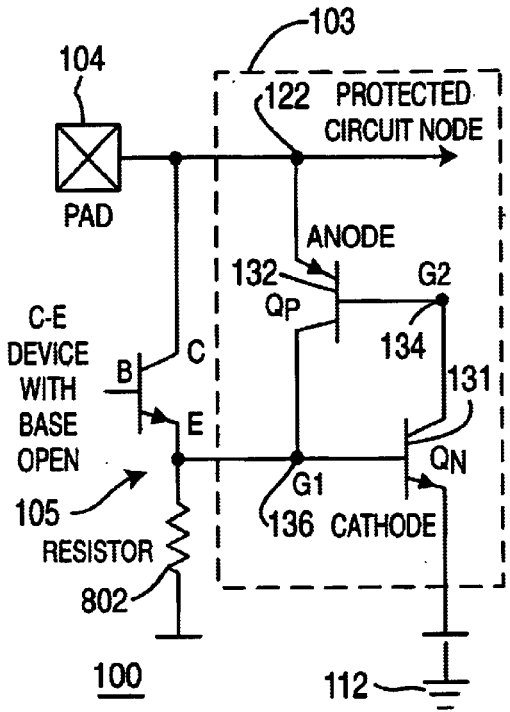
Figure 8C:
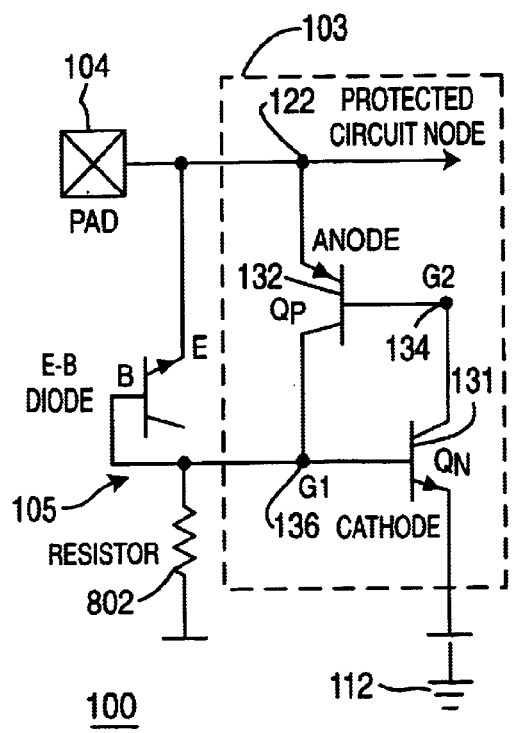

FIGS. 8A–8C depict exemplary schematic diagram embodiments of the trigger devices illustrated in FIGS. 6 and 7. In particular, each schematic drawing shows the trigger device 105 coupled to the SCR that collectively form the ESD protection device 102 that protects functional circuitry 101 on the IC 100. Further, an external on-chip resistor 802 is coupled from the triggering device 105 at node 136 to ground 112.

FIG. 6 depicts a cross-sectional view of a second embodiment of a trigger device 105 of the present invention. FIG. 8A illustrates a collector-base diode of the heterojunction bipolar transistor HBT105 with a shorted base-emitter. FIG. 8B illustrates a collector-emitter device with an open base. The structure shown in FIG. 6 may be used in either configuration shown in FIGS. 8A and 8B, depending on how the base terminal is externally connected.

In particular, FIG. 6 depicts a trigger device 105 for a SiGe SCR utilizing the collector-emitter breakdown of a heterojunction bipolar transistor (HBT). FIG. 6 is structurally the same as depicted in FIG. 5B, except that an N+ emitter region 602 is formed over the SiGe P doped region 514 and between the P base poly silicon regions 522$_1$ and 522$_2$. More specifically, insulative layers 624 are formed between the N+ emitter region 602 and the P base poly silicon regions 522$_1$ and 522$_2$. As such, an emitter opening 630 is defined beneath the N+ emitter region 602 and within the edges of the insulative layers 624, as discussed above with regard to the SCR 103.

One advantage of incorporating the N+ emitter region 602 into the trigger device 105 is to reduce the trigger voltage. Furthermore, the N+ emitter region 602 provides an intrinsically more robust trigger element because of the internal current amplification, as well as the vertical current flow from the emitter to the collector. It is noted that the collector is tied to the higher potential in the ESD protection circuit, while the base and emitter are both coupled to a lower potential (e.g., gate G1 136) of the HBT SCR 103.

In an alternative embodiment of FIG. 6, an N-well 604 (drawn in phantom) is provided in a similar manner as described in regard to FIGS. 5A and 5B. The N-well 604 is provided inside the N-epi layer 508 to further lower the trigger voltage by increasing the doping concentration (e.g. $10^{18}$ atoms/cm$^{-3}$ at the N-side of the junction in the same manner as discussed with respect to FIGS. 5A and 5B.

As discussed above, the structure shown in FIG. 6 may have the base externally coupled to the emitter (FIG. 8A) or floating (FIG. 8B). The advantage of the structures having the emitter connected (FIGS. 8A and 8B) over the structure with collector-base breakdown (FIGS. 5A and 5B) is a more robust trigger device, as discussed earlier. Shorting the base-emitter (FIG. 8A) results in a breakdown and thus a triggering voltage for the ESD protection device 102 of typically 6 to 9 Volts. A floating base (FIG. 8B) results in a lowered breakdown voltage of typically 4 to 7 Volts. Depending on the desired trigger voltage of the specific application, the proper version (FIG. 8A or 8B) may be selected.

FIG. 7 depicts a cross-sectional view of a second embodiment of a trigger device 105 of the present invention, and FIG. 8C illustrates an emitter-base diode with an open collector, as shown in FIG. 7.

Referring to FIG. 7, the emitter-base diode trigger device 105 is a SiGe SCR utilizing the base-emitter breakdown of the heterojunction bipolar transistor (HBT). In particular, the BLN 505 and N-epitaxial layer 508 are disposed over the P-substrate 203, as discussed above with regard to the other trigger device embodiments of FIGS. 5 and 6.

The SiGe P-base layer 514 is formed over the N-epi layer 508, however an insulative material provided during formation of the STI 518 is formed over the N-epi layer 508, thereby isolating the SiGe P-base layer 514 from the N-epi layer 508. As such, the base to collector junction of the HBT layer 508 is omitted from the trigger device 105. Accordingly, the trigger device 105 comprises the base-emitter diode formed between the N+ emitter region 602 and the SiGe P-base layer 514.

The embodiment of FIG. 7 has breakdown voltage that is lower than any of the embodiments in FIGS. 5A, 5B, 6, 8A, and 8B. The low breakdown voltage of FIG. 7 is due to the heterojunction formed by the highly P doped SiGe base region 514 and the again highly doped N+ emitter region 602. As discussed above, an increase in the doping levels reduces the breakdown voltage. The emitter to base breakdown voltage of the trigger device of FIG. 7 is typically in a range between 4 and 6 Volts.

Providing an SCR 103 with a structural formation including a vertical NPN transistor 131 in conjunction with a lateral PNP transistor decreases the turn-on time of the SCR 103. Specifically, the SCR performance improves due to the high current that flows in the vertical NPN transistor 131, as compared to a SCR having a distributed (i.e., lateral) NPN transistor. Moreover, fabricating the base of the vertical NPN transistor 131 using a Silicon-Germanium lattice allows the SiGe SCR 103 to be used in high frequency applications, such as wireless devices. In particular, the P-doped SiGe base provides an extremely low junction capacitance to the low-doped N-epi collector region underneath it, which is well suited for RF applications.

The triggering devices 105 may also be fabricated using the SiGe technologies. Specifically, a heterojunction diode is coupled to a gate of the SCR, such that the reverse breakdown voltage of the heterojunction diode defines the trigger voltage to the SCR. Although the heterojunction triggering devices are preferred for high frequency applications, one skilled in the art will appreciate that other triggering devices may be coupled to the SCR 103 of the present invention to trigger the SCR.

It is noted that the HBD devices in FIGS. 5A, 5B, 6, and 7 have been discussed in terms of being used as trigger devices for the ESD-SCR. However, the HBD devices may also be used as ESD protection devices by themselves. That is, the diodes can be applied to shunt an ESD pulse having the 'opposite polarity'. Opposite polarity means that the pad connected to the protected circuitry receives a negative ESD pulse with respect to ground. In this case, the diode (and not the e.g. SCR) will provide the conductive path to safely discharge the ESD event.

Figure 9:
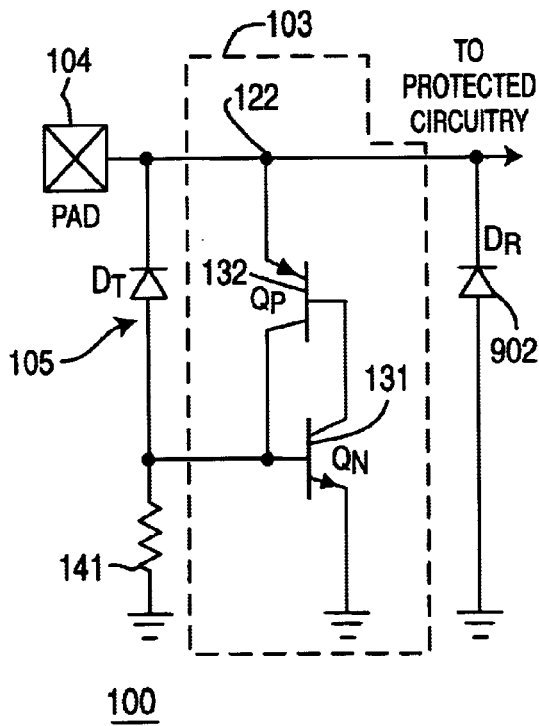
FIG. 9 depicts a schematic diagram of the SCR ESD protection device of FIG. 1B coupled to a shunt diode.

FIG. 9 depicts a schematic diagram of the SCR ESD protection device of FIG. 1B coupled to a shunt diode 902. FIG. 9 illustrates the use of a shunt diode 902 to shunt an ESD pulse having the opposite polarity. The schematic drawing of FIG. 9 is the same as the schematic drawing of FIG. 1B, such that the triggering device 105 is a diode, and the shunt diode 902 is coupled to the anode 122 of the SCR 103 as well as the pad 104, and to ground 112. Specifically, the cathode of the trigger diode 105 is coupled to ground 112 via the resistor 141, while the anode of the trigger diode 105 is coupled to the pad 104. Further, the cathode of the shunt diode 902 is coupled directly to ground 112, while the anode of the shunt diode is coupled to pad 104.

A preferred embodiment for this type of application in FIG. 9 is the HBD device 500, as shown in FIG. 5A. The embodiment shown in FIG. 5A illustrates a direct anode (base) contact providing the lowest possible forward on-resistance, which makes it most suitable as shunt element. The direct anode (base) contact of FIG. 5A allows maximum current flow at the heterojunction, as opposed to the prior art devices that utilize indirect anode (base contact), which restricts current flow there through. It is noted that the other HBD diodes as shown in FIGS. 5B, 6, and 7 may also be used as ESD shunt devices, however these embodiments are better suited as triggering devices for the SCR. These other HBD diodes provide lower performance due to the higher resistance and lower current capability, however, as trigger devices they benefit from a typically lower breakdown voltage.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) protection device having a heterojunction bipolar transistor silicon controlled rectifier (HBT-SCR), comprising:
    a substrate;
    an N-doped layer disposed over said substrate;
    a first P doped region disposed over said N-doped layer, wherein said first P doped region comprises a P doped silicon-germanium material;
    at least one first N+ doped region forming a cathode, said at least one first N+ doped region disposed over said first P doped region and coupled to ground, wherein said at least one first N+ doped region, said first P-doped region, and said N-doped layer form a vertical NPN transistor of said HBT-SCR; and
    at least one second P doped region forming an anode of said SCR and adapted for coupling to a protected pad, said at least one second P doped region disposed over said N-doped layer and laterally positioned with respect to said first P doped region and electrically isolated from said first P doped region, wherein said at least one second P doped region, said N-doped layer, and said first P doped region form a lateral PNP transistor of said HBT-SCR.

2. The ESD protection device of claim 1, wherein said at least one first N+ doped region comprises a N+ doped polysilicon material.

3. The ESD protection device of claim 1, wherein said at least one first N+ doped region partially defines thereunder an emitter opening in said N-doped layer.

4. The ESD protection device of claim 1, wherein said first P doped region comprises a graded silicon-germanium material having a lower concentration of Germanium near a base-emitter junction and a higher concentration of Germanium near a base-collector junction of the vertical NPN transistor.

5. The ESD protection device of claim 1, wherein said at least one second P doped region comprises a silicon-germanium material.

6. The ESD protection device of claim 1, wherein a shallow trench isolation (STI) region electrically isolates said first P doped region from said at least one second P doped region.

7. The ESD protection device of claim 1, further comprising deep trench isolation (DTI) ring laterally isolating said N-doped layer.

8. The ESD protection device of claim 1, further comprising a first gate electrically coupled to said first P doped region.

9. The ESD protection device of claim 8, wherein said first gate comprises at least one P+ poly silicon region.

10. The ESD protection device of claim 1, further comprising a second gate electrically coupled to said N-doped layer.

11. The ESD protection device of claim 10, wherein said second gate comprises at least one second N+ doped region disposed over the N-doped layer.

12. The ESD protection device of claim 8, further comprising a buried N-doped layer disposed between said N-doped layer and said substrate.

13. The ESD protection device of claim 12, further comprising at least one N+ sinker region disposed respectively between said at least one second N+ doped region and said BLN.

14. The ESD protection device of claim 11, further comprising shallow trench isolation (STI) regions formed between and electrically isolating said at least one second P doped region respectively from said at least one second N+ doped region.

15. The ESD protection device of claim 11, further comprising an N-well disposed over said N-doped layer and beneath said first P doped region, said at least one second P doped region, and said at least one second N+ doped region.

16. The ESD protection device of claim 1, wherein said at least one second P doped region further comprises a plurality of second P doped regions formed symmetrically with respect to said first N+ doped region.

17. The ESD protection device of claim 1, wherein said at least one second N+ doped regions comprises a plurality of second N+ doped regions interspersed and aligned over said N-doped layer.

18. The ESD protection device of claim 17, further comprising a plurality of P+ poly silicon regions interspersed and aligned respectively between said plurality of N+ doped regions and over said N-doped layer.

19. The ESD protection device of claim 1, further comprising an external on-chip triggering device coupled to a gate of the SCR.

20. The ESD protection device of claim 19, wherein said external on-chip triggering device comprises a first terminal coupled to ground and a second terminal coupled to a second gate of said SCR.

21. The ESD protection device of claim 19, wherein said external on-chip triggering device comprises a first terminal coupled to a first gate of the SCR and a second terminal coupled to the pad.

22. The ESD protection device of claim 21, wherein said trigger device further comprises:
    a second N-doped layer disposed over said substrate;
    a third P doped region disposed over the second N-doped layer, wherein said second N-doped layer and third P doped region form a vertical PN diode;
    at least one second P+ polysilicon region formed over said third P doped region forming an anode of said diode and defining said first terminal;
    at least one third N+ doped region disposed over said second N-doped layer and forming a cathode of said diode and defining said second terminal of said diode; and shallow trench isolation (STI) formed between said at least one third N+ doped region and said third P doped region.

23. The ESD protection device of claim 22, wherein said third P doped region comprises silicon germanium.

24. The ESD protection device of claim 22, wherein at least one second P+ polysilicon region is formed over a portion of said third P doped region that is over said STI and indirectly over said second N-doped layer.

25. The ESD protection device of claim 22, wherein at least one second P+ polysilicon region is formed directly over a portion of said third P doped region that is over said second N-doped layer.

26. The ESD protection device of claim 22, further comprising an N-well formed in said second N-doped layer and beneath said third P doped region and said at least one third N+ doped region.

27. The ESD protection device of claim 22, further comprising a deep trench isolation (DTI) ring laterally isolating said second N-doped layer.

28. The ESD protection device of claim 19, wherein said trigger device comprises:
a second N-doped layer disposed over said substrate;
a third P doped region disposed over a second N-doped layer;
at least one second P+ polysilicon region formed over said third P doped region and defining a first terminal of said trigger device;
at least one third N+ doped region disposed over said second N-doped layer and forming a second terminal of said trigger device;
shallow trench isolation (STI) formed between said at least one third N+ doped region and said third P doped region, wherein a portion of said third P doped region is disposed over a portion of said STI; and
a fourth N+ doped region disposed over said third P doped region and adjacent to said at least one second P+ polysilicon region, said fourth N+ doped region defining a third terminal of said trigger device.

29. The ESD protection device of claim 28, wherein:
said first terminal is coupled to a first gate of said SCR;
said second terminal is coupled to said pad; and
said third terminal is coupled to said first terminal.

30. The ESD protection device of claim 28, wherein:
said first terminal is open;
said second terminal is coupled to said pad; and
said third terminal is coupled to a first gate of said SCR.

31. The ESD protection device of claim 28, wherein:
said first terminal is coupled to a first gate of said SCR;
said second terminal is open; and
said third terminal is coupled to said pad.

32. The ESD protection device of claim 19, wherein said external trigger device comprises:
a second N-doped layer formed over said substrate;
a shallow trench isolation layer (STI) formed over a second N-doped layer;
a third P doped region disposed over said STI;
an N+ polysilicon region disposed over a portion of said third P doped region; and
at least one P+ polysilicon region formed over said third P doped region and lateral to said N+ region.

33. The ESD protection device of claim 19, further comprising an external shunt resistor coupled between the pad and said second gate.

34. The ESD protection device of claim 19, further comprising an external shunt resistor coupled between said first gate and ground.

35. An electrostatic discharge (ESD) protection device, comprising:
a heterojunction bipolar transistor silicon controlled rectifier (HBT-SCR) having an anode adapted for coupling to a pad of protected circuitry, and a cathode adapted for coupling to ground, said HBT-SCR further comprising a plurality of doped regions, wherein at least one of said doped regions comprises a silicon-germanium material.

36. The ESD protection device of claim 35, wherein said HBT-SCR further comprises:
a first vertical transistor;
a second lateral transistor coupled to said first vertical transistor; and
wherein said first vertical transistor and said second lateral transistor respectively form said anode and said cathode of the SCR.

* * * * *